United States Patent [19]

Wanlass

[11] Patent Number: 4,935,384

[45] Date of Patent: Jun. 19, 1990

[54] METHOD OF PASSIVATING SEMICONDUCTOR SURFACES

[75] Inventor: Mark W. Wanlass, Golden, Colo.

[73] Assignee: The United States of America as represented by the United States Department of Energy, Washington, D.C.

[21] Appl. No.: 284,222

[22] Filed: Dec. 14, 1988

[51] Int. Cl.$^5$ .................. H01L 21/203; H01L 21/20
[52] U.S. Cl. ................... 437/107; 148/DIG. 15; 148/DIG. 65; 148/DIG. 97; 156/610; 357/52; 437/12; 437/96; 437/133; 437/976; 437/980
[58] Field of Search ................. 148/DIG. 15, 22, 56, 148/65, 97, 110, 122, 125; 156/610–615; 437/10, 12, 86, 95, 101, 96, 104, 107, 133, 109, 233, 234, 925, 939, 946, 967, 976, 980; 357/52

[56] References Cited

U.S. PATENT DOCUMENTS

| | | | |
|---|---|---|---|
| 3,458,369 | 7/1969 | Marinace | 437/226 |
| 3,862,852 | 1/1975 | Kamins | 437/980 |
| 4,207,586 | 6/1980 | Lebailly | 357/52 |
| 4,326,330 | 4/1982 | LePage et al. | 437/133 |
| 4,504,334 | 3/1985 | Schaake et al. | 437/12 |
| 4,525,239 | 6/1985 | Wang | 156/645 |
| 4,548,658 | 10/1985 | Cook | 437/126 |
| 4,561,171 | 12/1985 | Schlosser | 437/12 |
| 4,578,127 | 3/1986 | Gossard et al. | 156/610 |
| 4,593,304 | 6/1986 | Slayman et al. | 357/52 |
| 4,665,413 | 5/1987 | Calviello | 357/56 |
| 4,683,163 | 7/1987 | Jarry et al. | 428/209 |
| 4,687,922 | 8/1987 | Lemonier et al. | 437/980 |

FOREIGN PATENT DOCUMENTS 0159741  7/1986  Japan .................... 437/12

OTHER PUBLICATIONS

Olego, "Effects of ZnSe Epitaxial Growth on the Surface", Properties of GaAs, Appl. Phys. Lett., 51(18), pp. 1422–1424, (1987).

*Primary Examiner*—Brian E. Hearn
*Assistant Examiner*—William Bunch
*Attorney, Agent, or Firm*—Kenneth Richardson; James W. Weinberger; William R. Moser

[57] ABSTRACT

A method of passivating Group III-V or II-VI semiconductor compound surfaces. The method includes selecting a passivating material having a lattice constant substantially mismatched to the lattice constant of the semiconductor compound. The passivating material is then grown as an ultrathin layer of passivating material on the surface of the Group III-V or II-VI semiconductor compound. The passivating material is grown to a thickness sufficient to maintain a coherent interface between the ultrathin passivating material and the semiconductor compound. In addition, a device formed from such method is also disclosed.

10 Claims, No Drawings

METHOD OF PASSIVATING SEMICONDUCTOR SURFACES

CONTRACTUAL ORIGIN OF THE INVENTION

The United States Government has rights in this invention under Contract No. DE-AC02-83CH10093 between the United States Department of Energy and the Solar Energy Research Institute, a Division of the Midwest Research Institute.

BACKGROUND OF THE INVENTION

1. Field of the Invention

The present invention relates generally to the conditioning of semiconductor surfaces and, more particularly, to the passivation of such semiconductor surfaces, that is, the elimination of minority carrier recombination via surface states. Specifically, the present invention relates to the passivation of Group III-V or II-VI semiconductor surfaces utilizing a passivating material which is specifically lattice mismatched to the principal semiconductor material.

2. Description of the Prior Art

It has become a relatively standard procedure to form heterostructures of Group III-V and Group II-VI semiconductor materials by utilizing well-known epitaxial growth techniques such as molecular beam epitaxy or metalorganic chemical vapor deposition. Considerable effort has been committed to the characterization of structural properties of these heterostructures in terms of dislocations, defects, and crystal strain as well as of transport and electro-optical properties of the grown layers.

A particular application of such heterostructures involves the surface passivation of Group III-IV semiconductors. The passivation of Group III-V semiconductor surfaces, that is, the elimination of minority carrier recombination via surface states using high-bandgap window layers, has traditionally been limited to materials systems that are nearly perfectly lattice matched. Lattice matching has been found to be necessary in the past in order to eliminate interface states and thus provide effective passivation of the principal semiconductor material. The necessity for such lattice matching has severely limited the number of materials systems which can benefit from window layer passivation.

One example of epitaxial growth of a window material on the surface of a semiconductor substrate is illustrated in an article entitled "Effects of ZnSe Epitaxial Growth on the Surface Properties of GaAs", Applied Physics Letters 51(18), 2 Nov. 1987, pgs. 1422-1424. In this particular disclosure, it is shown that the formation of ZnSe/GaAs heterostructures results in effective passivation of the GaAs surface due to the extremely close lattice matching between the passivating material (ZnSe) and the principal semiconductor material (GaAs).

The successful use of significantly lattice-mismatched materials for passivation would substantially increase the number of materials systems which can benefit from window layer passivation, as well as possibly reduce the cost thereof due to the use of readily available materials. Although efforts in their vein have been attempted in the past, the resultant semiconductor devices have not been particularly effective due to the deleterious effects of lattice mismatch. Heteroepitaxy of lattice-mismatched materials is generally deemed to be undesirable due to the high density of dislocations created in the grown layers. Dislocations form in order to reduce the interfacial strain between the lattice mismatched layers and significantly reduce the performance of semiconductor devices formed therein. Consequently, while the use of closely lattice-matched materials for passivation provides highly efficient semiconductor devices, the effective use of significantly less closely lattice-matched materials would have several advantages, including a wider selection of materials combinations and, in some cases, reduced cost. Thus, there still remains a need to provide a system or method for passivating semiconductor surfaces which is low in cost, readily achievable, and applicable to a wide spectrum of semiconductors.

SUMMARY OF THE INVENTION

Accordingly, it is one object of the present invention to provide a method for passivating the surface of a semiconductor device.

Another object of the present invention is to provide a method of forming passivated heterostructures of Group III-V or II-VI semiconductor materials.

Yet another object of the present invention is to provide a semiconductor device useful in photovoltaic applications having a passivating layer made from a significantly lattice-mismatched material to provide a device which is low in cost and readily constructed.

To achieve the foregoing and other objects and in accordance with the purpose of the present invention, as embodied and broadly described herein, a method is provided for passivating Group III-V or II-VI semiconductor compound surfaces. The method includes selecting a passivating material which has a lattice constant substantially mismatched to the lattice constant of the semiconductor compound. The passivating material is then grown as an ultrathin layer of passivating material on the surface of the Group III-V or II-VI semiconductor compound. The passivating material is grown to a thickness sufficient to maintain a coherent interface between the ultrathin passivating material and the semiconductor compound.

DETAILED DESCRIPTION OF THE PREFERRED EMBODIMENT

While the use of lattice-mismatched materials for passivation purposes has previously been viewed as undesirable, it has been discovered that it is possible to grow significantly lattice-mismatched heterostructures that are essentially dislocation-free if the thickness of the grown layer is kept below a certain critical thickness, as described below. It has been found that an ultrathin mismatched epitaxial layer can be grown without dislocation formation on a bulk underlying layer under conditions which maintain a coherent interface between the two layers. The term "coherent" in this case refers to the fact that the epilayer takes on the same lattice constant as the bulk layer under such conditions, thus providing an epilayer/bulk layer interface which is functionally lattice matched, even though the respective lattice constants for each of the materials in bulk form may be substantially different. In other words, when a lattice-mismatched epilayer remains coherent, it means that the bulk lattice constant mismatch between the epilayer and the underlying layer is accommodated by uniform elastic deformation of the epilayer rather than through the generation of dislocations at the junction of the layers. Thus, it has been determined that almost any lattice-mismatched epilayer can be grown dislocation-free so long as its thickness is kept below the critical value wherein coherency is defined.

The critical thickness as a function of lattice mismatch will vary from composition to composition. However, the critical thickness of a strained epilayer is defined as that thickness below which the biaxial strain between the mismatched layers is accommodated by uniform elastic deformation of the epilayer such that it assumes the lattice constant of the bulk semiconductor layer. When the critical thickness is surpassed, the strain between the mismatched layers is sufficient to favor the nucleation of misfit dislocation at their interface. In this instance, the interface between the layers is no longer coherent due to the formation of dislocations in the epilayer. While the maximum thickness defined by such critical thickness will vary, as indicated above, it is believed that the critical thickness for most material combinations will be in the 50–500 Angstrom range. The actual determination of the critical thickness of a particular passivating material deposited on a particular semiconductor material depends on a number of different parameters. Such parameters include the elastic constants relating to the particular materials and other factors including those related to the strain energy and the energy required to nucleate misfit dislocations.

For photovoltaic applications, it is preferred that the passivating material also be a window material to permit light to pass therethrough to the semiconductor surface upon which the window layer has been grown. In order to provide a functionally efficient window layer, the preferred embodiment includes that the passivating material is selected from a high bandgap material that is lattice mismatched to the semiconductor material which has a lower energy bandgap. Moreover, in order for a mismatched layer to remain coherent, it is essential that the layer be grown to a value below the critical thickness rather than being deposited and then thinned through mechanical or chemical action. Other factors relating to the determination of the critical thickness of any given material combination also include the percent strain due to the lattice mismatch, the crystal growth temperatures, and other related factors. As previously indicated, 50–500 Angstroms is a range which will generally work for most material combinations as a critical thickness.

As previously indicated, almost any lattice-mismatched epilayer can be grown dislocation-free on a semiconductor surface as along as its thickness is kept below the critical thickness. Examples of certain combinations particularly useful in photovoltaic applications include the growth of an ultrathin layer of GaP as a window layer to passivate the surface of a p-on-n $GaAs_{1-x}P_x$ solar cell wherein x is preferably 0.30. GaP is a high bandgap material that is significantly lattice mismatched to the $GaAs_{1-x}P_x$ semiconductor device. Other examples of preferred window/semiconductor combinations include the growth of an $Al_xIn_{1-x}As$ layer on InP, wherein x preferably ranges from 0.5–0.8. Yet another example includes the growth of GaAsP on GaAs, and particularly $GaAs_{0.75}P_{0.25}$. In each of these instances, the passivating window layer is substantially lattice mismatched to the semiconductor device upon which it is grown. However, since the thickness of each passivating layer is maintained below the critical thickness, semiconductor devices with dislocation-free passivating layers are formed despite the lattice mismatch. The growth of such ultrathin passivating layers can be readily achieved on a semiconductor substrate utilizing any known epitaxial deposition technique; in particular, chemical vapor deposition (CVD) and molecular beam epitaxial (MBE) procedures are preferred.

The design considerations for a particular coherent window layer/bulk layer system generally include choosing material combinations which have the highest band gap differential for the lowest amount of lattice mismatch. For Group III-V semiconductors, some examples include GaAsP/GaAs, AlInAs/InP and AlInP/InP. The window layer serves two purposes: (1) It ensures a low interface recombination velocity by providing a coherent interface, and (2) it forms a potential barrier of finite height and width to the diffusion of photogenerated minority carriers to the free surface. Accordingly, the effectiveness of the window layer will improve by increasing both the layer thickness (t) and the band edge discontinuity (BED) in the minority carrier band (i.e., the relevant BED will depend on whether the material is n- or p-type). Within the constraint that the window layer remain coherent, the parameters t and BED are coupled, thus imposing limits on the maximum value of each parameter. An upper limit on t is given by the critical thickness ($h_c$) which is determined by both the lattice mismatch and the mechanical properties of the window layer and bulk layer materials. Likewise, the BED is limited because, in general, as the BED is increased (by changing the composition of the window layer), the lattice mismatch increases which in turn reduces $h_c$. The quantities required to calculate $h_c$ for a particular system are generally not precisely known, especially for the multinary compounds suggested by this invention. From previous work on strained-layer III-V systems, typical values of $h_c$ are 150 angstroms for a lattice mismatch of about 1%, and 500 angstroms for a mismatch of 0.4%. Furthermore, since the window layer is elastically deformed, it is expected that its band gap will differ from the bulk value; however, the deviation should be no more than a few percent since the deformation potentials for most III-V compounds are typically only a few electron volts. With all of the above taken into account, it seems likely that the optimum values of t and the BED for a particular coherent window layer/bulk layer system must be determined empirically due to the uncertainty and complexity of factors governing each parameter and their interrelationship.

As can be seen from the above, the present invention provides a method wherein semiconductor devices may be passivated using significantly lattice-mismatched materials. The invention thus has novel features which are particularly useful. If the present invention is utilized with solar cells or other optical devices, this type of passivating window layer will yield improved efficiencies since it is so thin, as well as reduced cost since the choice of materials is substantially greater. The amount of expensive material consumed to fabricate such a window would also be minimized due to the thinness of the material. Moreover, since lattice matching is not necessary, almost any Group III-V or II-VI material surface can be passivated utilizing the present invention with any other higher bandgap Group III-V or II-VI material, respectively.

While the foregoing description and illustration of the present invention has been particularly shown in detail with reference to preferred embodiments and modifications thereof, it should be understood by those skilled in the art that the foregoing and other modifications are exemplary only, and that equivalent changes in composition and detail may be employed therein without departing from the sphere and scope of the invention as claimed except as precluded by the prior art.

The embodiments in which an exclusive property or privilege is claimed are defined as follows:

1. A method of passivating Group III-V and II-VI semiconductor compound surfaces comprising selecting a passivating material having a lattice constant substantially mismatched to the lattice constant of said semiconductor compound, and growing an ultrathin epitaxial layer of said passivating material on the surface of said semiconductor compound to a thickness sufficient to maintain a coherent interface between said passivating material and said semiconductor compound; wherein said passivating material comprises a higher bandgap composition to form a window layer on said semiconductor compound surface; and wherein the maximum thickness of said ultrathin passivating material comprises that thickness above which dislocations begin to nucleate because of excessive strain energy between said passivating material and said semiconductor compound.

2. The method as claimed in claim 1, wherein said passivating material comprises a composition selected from Group III-V or II-VI materials.

3. The method as claimed in claim 1, wherein said passivating material on semiconductor compound combinations are selected from the group consisting of GaP on $GaAs_{1-x}P_x$, GaP on GaAs, AlInAs on InP, AlInP on InP, and GaAsP on GaAs.

4. The method as claimed in claim 1, wherein the maximum thickness of said ultrathin layer comprises 50–500 Angstroms.

5. The method as claimed in claim 1, wherein said passivating material is grown on said semiconductor compound utilizing Molecular Beam Epitaxy or Chemical Vapor Deposition techniques.

6. A method of forming heterostructures of Group III-V and II-VI semiconductor materials comprising:
   forming a p-n junction semiconductor device from said semiconductor materials; and
   growing an ultrathin epitaxial layer of passivating material on the surface of said semiconductor device of sufficient thickness to maintain coherency in said passivating material, said passivating material being selected from compositions substantially lattice-mismatched to said semiconductor device; wherein said passivating material has a higher bandgap than said p-n junction semiconductor device to form a window thereon; and wherein said ultrathin layer is grown on said p-n junction semiconductor device to a thickness below which the biaxial strain between said ultrathin layer and said p-n junction device is sufficient to nucleate dislocations in the surface layer due to lattice-mismatch therebetween.

7. The method as claimed in claim 6, wherein the maximum thickness of said layer is 50–500 Angstroms.

8. The method as claimed in claim 6, wherein said passivating material and semiconductor compound combinations are selected from the group consisting of GaP on $GaAs_{1-x}P_x$, GaP on GaAs, AlInAs on InP, AlInP on InP, and GaAsP on GaAs.

9. The method as claimed in claim 6, wherein said p-n junction device and said ultrathin layer are both selected from Group III-V and II-VI materials.

10. The method as claimed in claim 6, wherein said passivating material is grown directly on said semiconductor compound utilizing Molecular Beam Epitaxy or Chemical Vapor Deposition techniques.

* * * * *